(12) United States Patent
Cheung et al.

(10) Patent No.: US 7,303,647 B2
(45) Date of Patent: Dec. 4, 2007

(54) DRIVING MECHANISM FOR CHIP DETACHMENT APPARATUS

(75) Inventors: Yiu Ming Cheung, Hong Kong (HK); Shiqiang Yao, Hong Kong (HK); Gary Peter Widdowson, Hong Kong (HK)

(73) Assignee: ASM Assembly Automation Ltd., Hong Kong (CN)

( * ) Notice: Subject to any disclaimer, the term of this patent is extended or adjusted under 35 U.S.C. 154(b) by 89 days.

(21) Appl. No.: 10/977,674

(22) Filed: Oct. 29, 2004

(65) Prior Publication Data

US 2006/0090846 A1 May 4, 2006

(51) Int. Cl.
*B32B 38/10* (2006.01)

(52) U.S. Cl. .............. 156/344; 156/584; 438/464; 438/976

(58) Field of Classification Search .......... 156/344, 156/584; 438/464, 976
See application file for complete search history.

(56) References Cited

U.S. PATENT DOCUMENTS

| | | | |
|---|---|---|---|
| 4,850,780 A * | 7/1989 | Safabakhsh et al. ..... 414/416.1 |
| 4,990,051 A | 2/1991 | Safabakhsh et al. ........ 414/786 |
| 5,755,373 A | 5/1998 | Nakamura ................... 228/6.2 |
| 6,561,743 B1 | 5/2003 | Nakatsu ...................... 414/403 |
| 6,629,553 B2 | 10/2003 | Odashima et al. .......... 156/584 |
| 2002/0129899 A1* | 9/2002 | Mimata et al. ............. 156/344 |
| 2003/0070750 A1* | 4/2003 | Moore et al. ............... 156/249 |
| 2005/0255673 A1* | 11/2005 | Cheung et al. ............. 438/460 |

* cited by examiner

*Primary Examiner*—Mark A Osele
(74) *Attorney, Agent, or Firm*—Ostrolenk, Faber, Gerb & Soffen, LLP

(57) ABSTRACT

A driving mechanism and method are provided for driving a detachment tool adapted to detach a chip from an adhesive tape to which the chip is mounted. The mechanism includes a first actuator coupled to the detachment tool and operative to drive the detachment tool to move along a first axis substantially perpendicular to a surface of the chip, and a second actuator coupled to the detachment tool and operative to drive the detachment tool to move adjacent to a width of the chip along a second axis perpendicular to the first axis. The first actuator is configured for programmable movement along the first axis with respect to the chip in conjunction with the second actuator for movement adjacent the width of the chip to provide controlled lifting of the chip for propagation of delamination between the chip and the adhesive tape.

17 Claims, 2 Drawing Sheets

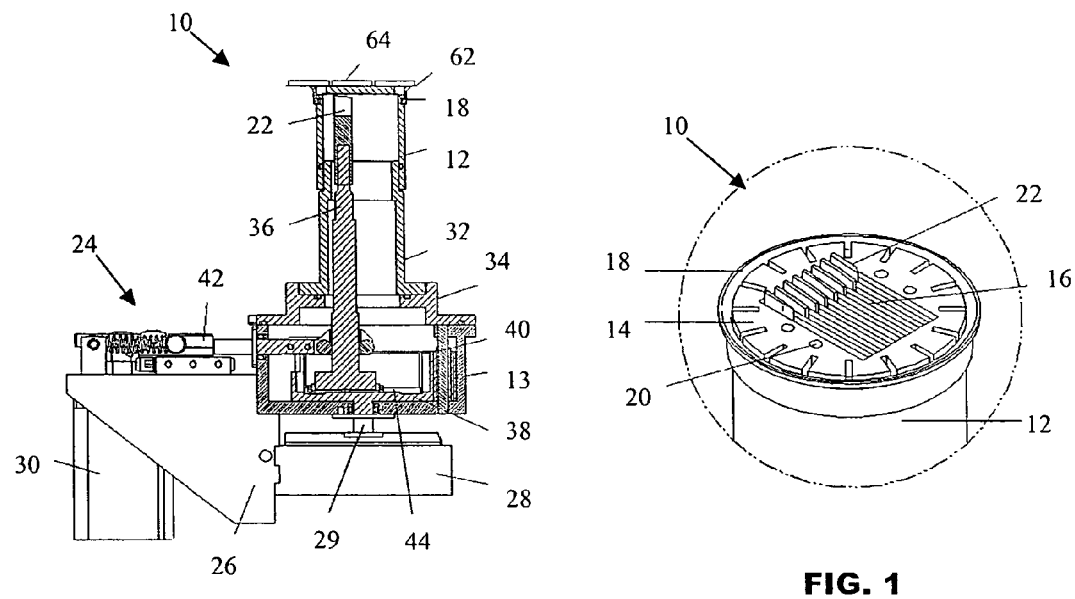
FIG. 2
FIG. 1
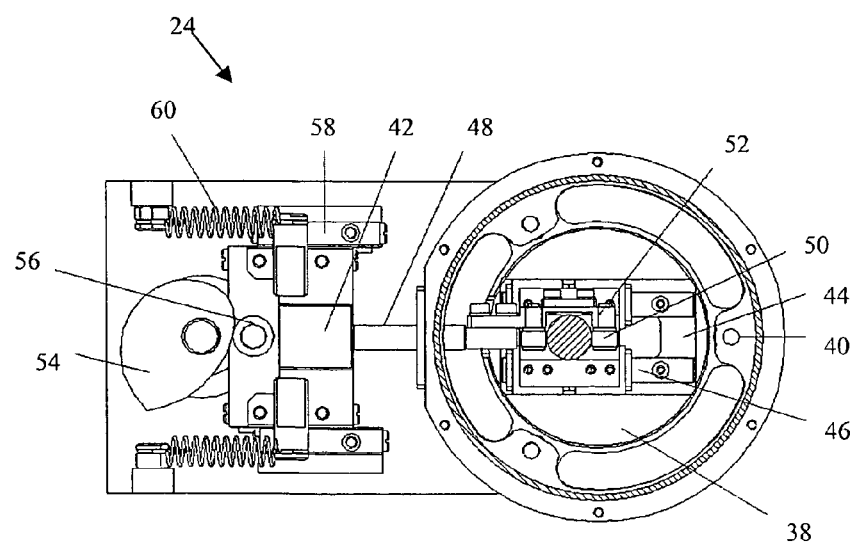
FIG. 3

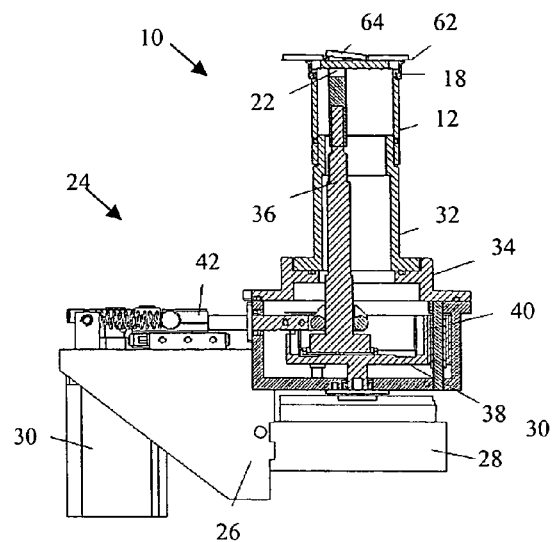 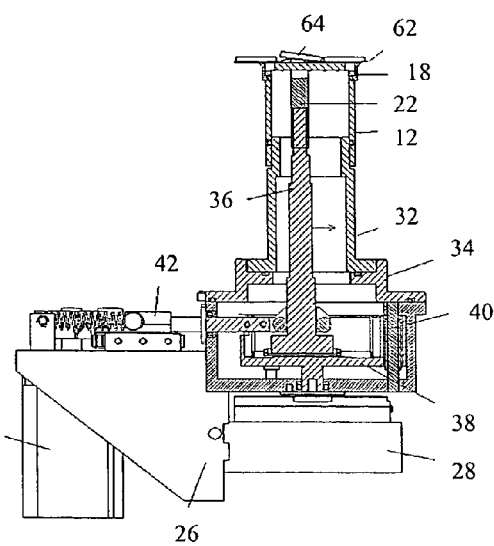
FIG. 4(a)        FIG. 4(b)
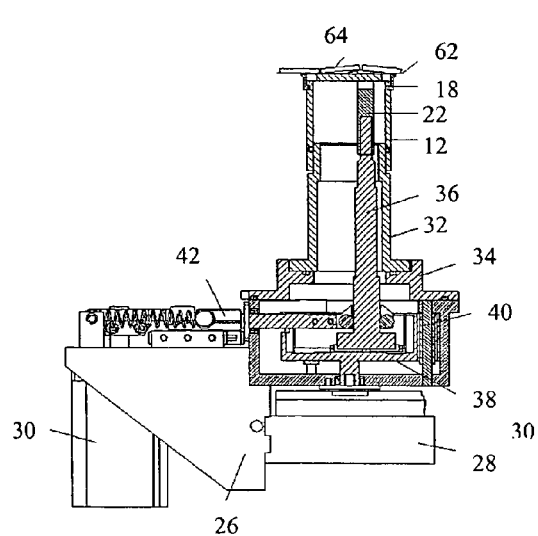 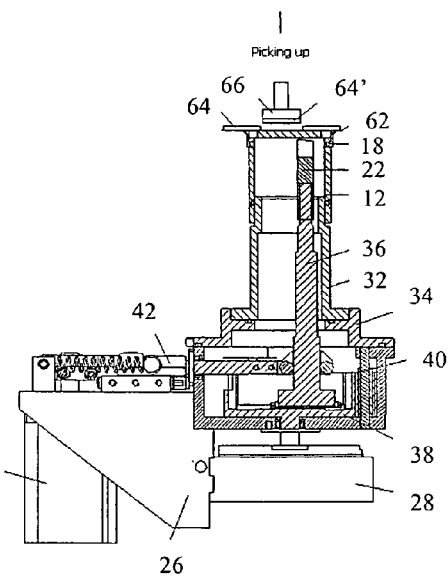
FIG. 4(c)        FIG. 4(d)

DRIVING MECHANISM FOR CHIP DETACHMENT APPARATUS

FIELD OF THE INVENTION

The invention relates to the detachment of a semiconductor die or integrated circuit chip from an adhesive tape on which it is mounted during processing, and in particular, to a driving mechanism for effecting such detachment.

BACKGROUND AND PRIOR ART

During a semiconductor package assembly process, there may be a need to detach a semiconductor chip from an adhesive tape carrier in chip bonding or flip chip bonding processes. This detachment is usually necessary where a slice of wafer comprising a plurality of said semiconductor chips has been mounted onto an adhesive tape (such as Mylar Film) for dicing, and each diced chip has to be removed from the adhesive tape and placed at a bonding location.

The first step of the detachment process generally includes generating a delamination or peeling action between the semiconductor chip and the adhesive tape. This is induced by an upward force exerted by a push-up tool located underneath the chip and adhesive tape, which is reinforced by suction force from a vacuum platform holding down the adhesive tape. It is usually necessary to sufficiently delaminate the chip from the adhesive surface of the tape before total removal therefrom. That is to enhance the ability to separate the chip from the adhesive tape, and also to avoid damage to the chip. Especially for chips that are thinner and larger, the adhesion between surfaces may cause a bending moment or stress in the chip. If this is too large, the chip will crack or break.

There are various apparatus in the prior art that seek to promote delamination between the chip and adhesive tape. They commonly comprise a holder securing the adhesive tape and motorized linear actuators installed underneath the holder and adhesive tape to control a detachment or push-up tool. The most common technique to detach a semiconductor chip or device from an adhesive tape uses single or multiple push-up pin(s) as push-up tools to lift the chip up above a platform while the platform is holding the tape down by vacuum suction, such as in U.S. Pat. No. 5,755,373 entitled "Die Push-Up Device". This push-up action of the pin(s) will create a force to peel the chip away from the adhesive tape. For this technique, the driving mechanism consists of a motorized linear actuator installed underneath the said vacuum platform (see FIG. 2 of the patent). The push-up pins are driven by this linear actuator to move vertical upwards and downwards. Alternative designs have also been implemented for peeling the chip from the adhesive tape, such as U.S. Pat. No. 4,990,051 entitled "Pre-peel Die Ejector Apparatus", which teaches having two or more steps comprised of outer and inner housing sections to control the deformation of the tape to improve the effectiveness of said push-up pin(s).

The disadvantage of using push-up pins is that a strong bending moment will be induced by the push-up action on the semiconductor chip if the induced force is not large enough to peel the chip off from adhesive tape. The bottom surface of chip will experience high compressive stress at the location(s) where the push-up pin(s) are directly acting upon the chip. The top surface of the die located directly above the push-up pin(s) will experience very high tension as the chip bends. The chip will be susceptible to crack failure if the strain induced by this bending moment exceeds its critical strain. This will be more prominent as the semiconductor chip gets thinner.

Another technique makes use of a push-up tool moving laterally across the vacuum platform to peel off a group of diced thin semiconductor devices from an adhesive tape. Such an apparatus is disclosed in U.S. Pat. No. 6,629,553 entitled "Method and System for Mounting Semiconductor Device, Semiconductor Device Separating System, and Method of Fabricating IC Card". In this apparatus, peeling of the diced semiconductor devices is propagated by the lateral motion of a push-up tool that is raised to an appropriate height against a non-adhesive back surface of the adhesive tape, and moved across the said back surface to delaminate a row of semiconductor devices before being lowered again.

In this chip detachment process, the push-up tool is an object with a curved surface. It is mounted on a movable assembly and the object is moved laterally across a width of the whole wafer by a motorized table. After raising the object at one end of the wafer, when the object reaches an opposite end of the wafer, it is lowered down to be ready for the next separation cycle. This configuration is not meant to be used in die attachment system which is adapted to separate and pick-and-place one singulated semiconductor chip at a time during the chip detachment process. Furthermore, the object is moved across a whole row of semiconductor chips at the same height. It does not take into account the fragility of thinner and larger chips which may require controlled movement both vertically and horizontally with respect to each chip for optimized peeling action without damaging the chip.

A similar process is discussed in U.S. Pat. No. 6,561,743 entitled "Pellet Picking Method and Pellet Picking Apparatus". However, the approach disclosed in this patent makes use of a stage of given height in place of the aforesaid object. This stage is movable on top of a vacuum platform along a horizontal plane in one direction. The vacuum suction provided by the holes on the platform together with a step formed in the stage creates sufficient tension on the adhesive tape to peel it away from the diced chips.

These prior art systems described above drive the push-up tools either vertically upwards and downwards, or laterally along a horizontal plane. Chip detachment by using vertically-driven push up pin(s) may not be practicable for critical applications involving large (eg. widths greater than 10 mm) and thin (eg. thickness less than 50 microns) semiconductor chips. On the other hand, if the driving mechanism provides only lateral motion for the push-up tool, it may not be easy to optimize the operating window for a given push-up tool in the detachment of large and thin semiconductor chips.

It is thus desirable to develop a driving mechanism that is operable to move a push-up tool in a combination of vertical and horizontal motions to assist in the delamination of each chip, especially for delaminating large and thin chips. It is also desirable that the driving mechanism is programmable in order to add versatility for adjusting for different operational requirements.

SUMMARY OF THE INVENTION

It is therefore an object of the present invention to seek to provide a driving mechanism that is operable to impart both vertical and horizontal motions to a detachment tool during detachment of a semiconductor chip from an adhesive tape.

According to a first aspect of the invention, there is provided a driving mechanism for driving a detachment tool adapted to detach a chip from an adhesive tape to which the chip is mounted, comprising: a first actuator coupled to the detachment tool and operative to drive the detachment tool to move along a first axis substantially perpendicular to a surface of the chip; and a second actuator coupled to the detachment tool and operative to drive the detachment tool to move adjacent to a width of the chip along a second axis perpendicular to the first axis; the first actuator being configured to drive the detachment tool for programmable movement along the first axis with respect to the chip in conjunction with the second actuator driving the detachment tool for movement adjacent the width of the chip to provide controlled lifting of the chip for propagation of delamination between the chip and the adhesive tape.

According to a second aspect of the invention, there is provided a method for driving a detachment tool to detach a chip from an adhesive tape to which the chip is mounted, comprising the steps of: driving the detachment tool to move along a first axis substantially perpendicular to a surface of the chip; and driving the detachment tool to move adjacent to a width of the chip along a second axis perpendicular to the first axis; wherein the detachment tool is programmably driven for movement along the first axis with respect to the chip in conjunction with driving the detachment tool for movement adjacent the width of the chip to provide controlled lifting of the chip for propagation of delamination between the chip and the adhesive tape.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of the driving mechanism in accordance with the invention will now be described with reference to the accompanying drawings, in which:

FIG. 1 is an isometric view of a chip detachment apparatus incorporating a driving mechanism according to a preferred embodiment of the invention;

FIG. 2 is a sectional side view of the chip detachment apparatus of FIG. 1 including the said driving mechanism;

FIG. 3 is a sectional plan view of the driving mechanism shown in FIG. 2; and

FIGS. 4(a)-4(d) are sectional side views of the chip detachment apparatus and driving mechanism of FIG. 2 showing the various stages of motion of the driving mechanism during a chip detachment process.

DETAILED DESCRIPTION OF THE PREFERRED EMBODIMENT

An embodiment of the driving mechanism according to the invention will be described herein with reference to a chip detachment apparatus as shown in FIGS. 1 to 3. FIG. 1 is an isometric view of a chip detachment apparatus 10 incorporating a driving mechanism according to the preferred embodiment of the invention. The chip detachment apparatus 10 includes a vacuum enclosure 12 for generating vacuum suction. On top of the vacuum enclosure 12, there is a flat vacuum platform 14. This platform 14 contains a plurality of slots 16 through which vacuum suction can be applied when an adhesive tape with singulated semiconductor chips mounted thereon is placed on the platform 14. A rubber circular seal ring 18 around the top of the platform 14 provides a vacuum seal during vacuum build-up along the interface between the platform 14 and the adhesive tape when vacuum suction is applied through a plurality of holes 20 and slots 16 located on the platform 14.

The adhesive tape will be secured onto the platform 14 when vacuum suction is applied in the vacuum enclosure 12. A detachment tool, which may be in the form of a push-up tool 22 for detaching semiconductor chips, may comprise a plurality of slotted projections that are adapted to protrude through the slots 16 of the platform 14 as shown in FIG. 1. This plurality of slots 16 extends across the surface of the platform 14. A curved front leading edge and right-angled trailing vertical edge on an upper portion of the push-up tool 22 facilitates the detachment of the semiconductor chip.

FIG. 2 is a sectional side view of the chip detachment apparatus 10 of FIG. 1 including the driving mechanism of the preferred embodiment of the invention. The chip detachment apparatus comprises two primary components: (i) an application tool set which consists of the vacuum enclosure 12 and the push-up tool 22, and (ii) a motorized actuation assembly 24 mounted on a mounting base 26 which provides programmable vertical and horizontal actuation for the push-up tool 22 during the chip detachment process.

The vertical motion is driven by a first actuator 28 (preferably in the form of a linear motor and more preferably in the form of a voice coil motor) coupled to the push-up tool 22 and operative to drive the push-up tool 22 to move along a first axis substantially perpendicular to a surface of a chip to be detached. The horizontal motion is driven by a second actuator 30 (preferably in the form of a rotary motor driving a linear cam mechanism) coupled to the push-up tool 22 and operative to drive the push-up tool 22 to move adjacent to a width of the chip along a second axis perpendicular to the first axis.

The vacuum enclosure 12 is mounted on an adapter 32 which is preferably designed to be replaceable for different applications. This adapter 32 constitutes part of a cover 34 for an enclosure 13 of the actuator assembly 24 which is firmly secured onto the mounting base 26. The push-up tool 22 is inserted and fastened onto a supporter, such as rod supporter 36. This rod supporter 36 is in turn mounted on a linear table 44 which can be moved horizontally. The linear table 44 is mounted on a vertically movable base 38 that is connected to the first actuator 28. This vertically movable base 38 and horizontal linear table 44 are respectively driven by the first and second actuators 28, 30 mentioned above.

FIG. 3 is a sectional plan view of the driving mechanism shown in FIG. 2. The first actuator 28 (voice coil motor assembly) of actuator assembly 24 is a linear motorized driving mechanism that provides a vertical driving force to move the push-up tool 22 up and down. This first actuator 28 is mounted and fixed onto the mounting base 26. A push rod 29 connected to the first actuator 28 pushes against the vertically movable base 38, and lifts and lowers the linear table 44 to move it up and down. The vertical motion of the vertically movable base 38 is guided by three sets of ball cage bearings 40.

In addition to the motorized driving mechanism of the first actuator 28 that moves the push-up tool 22 up and down vertically, the actuator assembly 24 includes the second actuator 30, such as a rotary motor driving a linear cam mechanism, that can drive the push-up tool 22 backwards and forwards (or left and right in FIG. 3) horizontally. The push-up tool 22 inserted onto the rod supporter 36 moves horizontally on the linear table 44 guided by a pair of LM blocks 46 as shown in FIG. 3. When a pusher table 42 and a pusher rod 48 move horizontally, the rod supporter 36 which is held by a bearing follower 50 and a connector 52 will be pushed to move correspondingly on the linear table 44. The second actuator 30 (rotary motor) drives and turns the linear cam mechanism, such as a linear cam 54, to provide linear actuation for the pusher table 42 via a cam follower roller 56. When the linear cam 54 turns in a clockwise direction, the pusher table 42 and pusher rod 48 will move in a forward direction. From the above set-up as described in the preferred embodiment of the second actuator 30, it would be appreciated that the push-up tool 22 is adapted for reciprocal movement along the second axis for a distance that is substantially equivalent to the width of the chip to be removed. The width of the chip can be as large as 20 mm.

The linear motion of the pusher table 42 is guided by a pair of cross-roller guides 58. Bearings in the cam follower roller 56 can greatly reduce the friction between the linear cam 54 and cam follower roller 56 (which is fixed on the pusher table 42) when they are in motion. The pusher table 42 is preferably spring preloaded. For this purpose, a pair of springs 60 are fixed to the pusher table 42 at one end, and fixed to the mounting base 26 at an opposite end. The springs 60 are used to pull the cam follower roller 56 of the pusher table 42 against the linear cam 54 during operation so as to bias the rod supporter 36 towards the linear cam 54. Sufficient preload from the springs 60 is needed to ensure that there is no gap between the cam follower roller 56 and the linear cam 54 during the whole horizontal/lateral motion stroke of the push-up tool 22. The springs 60 are also used to provide a returning force to the pusher table 42. The backward driving force for the pusher table 42 is provided by the contraction force of the pair of springs 60.

In this construction, the rod supporter 36 carrying the push-up tool 22 can move horizontally on the linear table 44 as well as vertically together with the vertically movable base 38. The bearing follower 50 on the rod supporter 36 is operative to decouple the vertical and horizontal/lateral movements of the driving mechanism.

Therefore, the first actuator 28 is configured to drive the push-up tool 22 for programmable movement along the first axis with respect to the chip in conjunction with the second actuator 30 driving the push-up tool 22 for movement adjacent the width of the chip to provide controlled lifting of the chip for propagation of delamination between the chip and the adhesive tape. The principle of the chip detachment according to the invention will now be described with reference to FIGS. 4(*a*) to (*d*).

At the beginning of a chip detachment process, the push-up tool 22 will be positioned at its initial horizontal position and stays at its standby height where it is just below the top surface of the platform 14. The targeted semiconductor chip 64 will be positioned at a location where its edge is in close proximity to and aligned with the straight vertical trailing edge of the push-up tool 22. The vertical trailing edge of the push-up tool 22 should be preferably less than 0.5 mm inside an edge of the semiconductor chip 64. Vacuum suction is applied through the holes 20 and slots 16 of the vacuum platform 14 such that the adhesive tape 62 is held down onto the platform 14. The sealing of the vacuum enclosure 12 and the enclosure 13 should be good enough to ensure a vacuum level of about −85 kPa inside these enclosures.

The push-up tool 22 will then rise to a predetermined height so that it is protruding from the top surface of the platform 14 and applying a force on the adhesive tape 62 against the back of the semiconductor chip 64. The tension induced on the adhesive tape 62 will peel the adhesive tape 62 away from the semiconductor chip 64. In the meantime, the tension on the adhesive tape 62 will induce a downward reaction force onto the push-up tool 22. This force has to be balanced by the driving force provided by the first actuator 28 (voice coil motor). The delamination at the interface between the semiconductor chip 64 and adhesive tape 62 will be initiated. The protruding portion of the push-up tool 22 is kept at a height (preferably between 0.2-1 mm) above the platform 14. At that height, it is moved laterally (horizontally) across the said platform 14 along the slots 16 at a programmable speed.

The horizontal or lateral motion of the push-up tool 22 is driven by the second actuator 30 (rotary motor) via a linkage containing the linear cam 54, the cam follower roller 56, pusher table 42, pusher rod 48, connector 52 and bearing follower 50. This second actuator 30 should be able to provide forward thrust of about 3 kgf for the push-up tool 22 to overcome the reaction force generated by the tensioned adhesive tape 62 during the horizontal motion of the push-up tool 22 above the platform 14. As the push-up tool 22 starts moving horizontally, there will be an additional downward reaction force acting on the push-up tool 22 since this horizontal/lateral motion of the tool 22 will create additional tension on the adhesive tape when it pushes against the adhesive tape 62. This additional downward force has to be balanced by the first actuator 28 which should be able to provide upward thrust of about 3 kgf. When the push-up tool 22 moves across the semiconductor chip 64, interfacial delamination between the adhesive tape 62 and the semiconductor chip 64 will follow and propagate across the whole chip 64. The speed of the lateral motion of the push-up tool 22 should not be greater than the propagation speed of this interfacial delamination. Otherwise, total separation between the chip 64 and the adhesive tape 62 may not be achieved. The propagation speed of this interfacial delamination is dictated by the adhesive strength along the interface between the semiconductor chip 64 and the adhesive tape 62.

One way to reduce the adhesive strength of the adhesive tape 62 is by operating the module at elevated temperature. It can be achieved by elevating the temperature of the top surface of the vacuum platform 14 to 40-90 degrees Celsius by using a heater element (not shown) located in the vacuum enclosure 12. In addition to the reduction of the interfacial adhesive strength, by elevating the operating temperature the propagation speed of interfacial delamination will also be increased.

When the push-up tool 22 moves to an opposite end of the semiconductor chip 64, the chip 64 should be substantially separated from the adhesive tape 62. The second actuator 30 is then stopped and the push-up tool 22 stays at this position. Then the first actuator 28 drives the push-up tool 22 to move downward to its standby level where the push-up tool 22 will totally withdraw below the top surface of the platform 14. The second actuator 30 will then turn the linear cam 54 backward and let the push-up tool 22 move back to its initial position on the left side and prepare for the next detachment procedure. When the push-up tool 22 is moving back to its initial position, a pickup tool 66 may be lowered down to pick up the detached semiconductor chip 64'. In an alternative process sequence, the pickup tool 66 can be lowered down at the beginning of the detachment cycle to a height that is close enough to receive the partially detached semiconductor chip 64 and provide support for the semiconductor chip 64 during delamination.

It should be appreciated that a new mechanism for detaching a semiconductor chip from the adhesive tape with minimal induced bending stress has been described herein. It is particularly useful in applications requiring detachment of large (greater than 10 mm width) and thin (less than 50 microns thickness) chips. In the described embodiment, the driving mechanism provides integrated and independent vertical and lateral motion to drive the push-up tool. Therefore, the motion profile of the push-up tool can be fine-tuned to achieve an optimized delamination process for different dimensions and characteristics of semiconductor chips to be detached.

Such a driving mechanism offers an integrated design that provides independent vertical and horizontal motion for the push-up tool used for semiconductor chip detachment. It also has the benefit of providing a compact design since its size is comparable to a single vertical motion actuator for similar applications.

With this design, the initial tool height, the time delay for lateral motion and the speed of horizontal/vertical motion become programmable parameters for the chip detachment process. These additional process parameters can be used to optimize the chip detachment process. Therefore, critical applications such as detaching very large and thin chips are possible. Accordingly, complex synchronized motion control profiles are possible for the application tool to optimize the chip detachment process. The speed for the horizontal/vertical motion of the application tool can be programmable within a large dynamic range. This allows the chip detachment apparatus to be used with adhesive tapes of both low adhesive strength (such as UV tapes) and large adhesive strength (such as ordinary dicing tape or non-UV type tapes).

Furthermore, this mechanization is designed to be mechanically compatible with actuation assemblies in traditional single vertical motion multiple push-up pin(s) chip detachment apparatus. Thus, it can be used in a system with chip detachment apparatus using either a two-axes (vertical and horizontal) motion control or single-axis (vertical) motion control.

The invention described herein is susceptible to variations, modifications and/or additions other than those specifically described and it is to be understood that the invention includes all such variations, modifications and/or additions which fall within the spirit and scope of the above description.

The invention claimed is:

1. A driving mechanism for driving a detachment tool adapted to detach a chip from an adhesive tape to which the chip is mounted, comprising:
    a supporter for the detachment tool;
    a first actuator coupled to the supporter and operative to drive the detachment tool to move along a first axis perpendicular to the chip;
    a bearing holding the supporter; and
    a second actuator coupled to the bearing and operative to drive the detachment tool to move along a second axis perpendicular to the first axis,
    the first actuator being configured to drive the detachment tool along the first axis with respect to the chip in conjunction with the second actuator driving the detachment tool for movement along the second axis to provide controlled lifting of the chip for propagation of delamination between the chip and the adhesive tape;
    the second actuator being coupled to the bearing and decoupled from the first actuator such that an axial movement of the detachment tool along the second axis caused by the second actuator does not produce a corresponding axial movement of the first actuator along the second axis.

2. The driving mechanism as claimed in claim 1, wherein the first actuator comprises a linear motor.

3. The driving mechanism as claimed in claim 2, wherein the linear motor comprises a voice coil motor.

4. The driving mechanism as claimed in claim 2, wherein the linear motor is coupled to the supporter via a movable base that is movable along the first axis, including a linear table mounted to the movable base-that is movable along the second axis.

5. The driving mechanism as claimed in claim 4, wherein the second actuator is configured to drive the supporter to move with the linear table.

6. The driving mechanism as claimed in claim 1, wherein the second actuator comprises a rotary motor driving a linear cam mechanism.

7. The driving mechanism as claimed in claim 6, including a spring mechanism operative to bias the supporter towards the linear cam mechanism.

8. The driving mechanism as claimed in claim 1, wherein the first axis is substantially perpendicular to a surface of the chip.

9. The driving mechanism as claimed in claim 8, wherein the second actuator is operative to drive the detachment tool for reciprocal movement along the second axis for a distance that is substantially equivalent to a width of the chip.

10. A method for driving a detachment tool to detach a chip from an adhesive tape to which the chip is mounted, comprising the steps of:
    driving a supporter with the detachment tool mounted thereon using a first actuator so as to move the detachment tool along a first axis perpendicular to the chip;
    driving a bearing holding the supporter using a second actuator so as to move the detachment tool along a second axis perpendicular to the first axis such that the axial movement of the detachment tool along the second axis caused by the second actuator does not produce a corresponding axial movement of the first actuator along the second axis;
    wherein the detachment tool is driven for movement along the first axis in conjunction with driving the detachment tool for movement along the second axis to provide controlled lifting of the chip for propagation of delamination between the chip and the adhesive tape.

11. The method as claimed in claim 10, wherein the step of driving the detachment tool along the second axis further comprises the step of moving the detachment tool reciprocally along the second axis for a distance that is substantially equivalent to the width of the chip.

12. The method as claimed in claim 10, wherein the detachment tool is driven along the first axis by a linear motor.

13. The method as claimed in claim 12, wherein the linear motor comprises a voice coil motor.

14. The method as claimed in claim 12, further comprising coupling the linear motor to the supporter via a movable base that is movable along the first axis, including mounting a linear table to the movable base that is movable along the second axis.

15. The method as claimed in claim 10, wherein the detachment tool is driven along the second axis by a rotary motor driving a linear cam mechanism.

16. The method as claimed in claim 15, including biasing the supporter along the second axis towards the linear cam mechanism with a spring mechanism.

17. The method as claimed in claim 10, wherein the first axis is substantially perpendicular to a surface of the chip.

* * * * *